(12) United States Patent
Wardenier

(10) Patent No.: US 8,184,265 B2
(45) Date of Patent: May 22, 2012

(54) CORRECTION METHOD FOR NON-UNIFORM RETICLE HEATING IN A LITHOGRAPHIC APPARATUS

(75) Inventor: Peter Hanzen Wardenier, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 515 days.

(21) Appl. No.: 12/492,473

(22) Filed: Jun. 26, 2009

(65) Prior Publication Data

US 2009/0323039 A1 Dec. 31, 2009

Related U.S. Application Data

(60) Provisional application No. 61/076,314, filed on Jun. 27, 2008.

(51) Int. Cl.
   *G03B 27/52* (2006.01)
(52) U.S. Cl. ............ 355/55; 355/52; 355/68
(58) Field of Classification Search ........... 355/52, 355/55, 68
   See application file for complete search history.

(56) References Cited

U.S. PATENT DOCUMENTS

| 4,614,431 A * | 9/1986 | Komeyama ............ 356/401 |
| 4,778,275 A * | 10/1988 | van den Brink et al. ...... 356/401 |
| 6,151,122 A | 11/2000 | Taniguchi et al. |
| 6,342,941 B1 | 1/2002 | Nei et al. |
| 6,406,820 B1 * | 6/2002 | Ota .................. 430/30 |
| 7,385,675 B2 * | 6/2008 | George et al. ............ 355/55 |
| 2005/0007572 A1 * | 1/2005 | George et al. ............ 355/55 |

FOREIGN PATENT DOCUMENTS

| JP | 08-227845 A | 9/1996 |
| JP | 09-266151 A | 10/1997 |
| JP | 10-289865 A | 10/1998 |
| JP | 11-354401 A | 12/1999 |
| JP | 2009-212276 A | 9/2009 |

OTHER PUBLICATIONS

English language Abstract of Japanese Patent Publication No. 08-227845 A, published Sep. 3, 1996, the Japanese Patent Office; 1 page.

English language Abstract of Japanese Patent Publication No. 09-266151 A, published Oct. 7, 1997, the Japanese Patent Office; 1 page.

(Continued)

*Primary Examiner* — Thomas R Artman
(74) *Attorney, Agent, or Firm* — Sterne, Kessler, Goldstein & Fox P.L.L.C

(57) ABSTRACT

A method that includes conditioning a radiation beam, imparting the radiation beam with a pattern to form a patterned radiation beam by a reticle having a pattern image area and a reticle mark, and projecting the patterned radiation beam onto a target portion of a substrate by a projection system. The method further includes illuminating the reticle mark by the radiation beam for generating an aerial image of the reticle, projecting the aerial image on an image sensor, collecting image data from the image sensor, obtaining from the image data positional parameters of the aerial image, and correcting any deviation of the positional parameters from a required position of the aerial image by compensating an illumination induced thermal expansion of the reticle by an estimated correction of magnification settings of the projection system, the estimated correction being calculated from a prediction of the temporal thermal expansion of the reticle.

15 Claims, 5 Drawing Sheets

OTHER PUBLICATIONS

English language Abstract of Japanese Patent Publication No. 10-289865 A, published Oct. 27, 1998, the Japanese Patent Office; 1 page.

English language Abstract of Japanese Patent Publication No. 11-354401 A, published Dec. 24, 1999, the Japanese Patent Office; 1 page.

English language Abstract of Japanese Patent Publication No. 2009-212276 A, published Sep. 17, 2009, the Japanese Patent Office; 1 page.

English translation of Japanese Notice of Reasons for Rejection directed to related Japanese Patent Application No. 2009-151813, the Japanese Patent Office; 3 pages.

* cited by examiner

CORRECTION METHOD FOR NON-UNIFORM RETICLE HEATING IN A LITHOGRAPHIC APPARATUS

CROSS-REFERENCE TO RELATED APPLICATIONS

The present application claims the benefit of U.S. Provisional Patent Application No. 61/076,314, filed Jun. 27, 2008, which is incorporated herein by reference in its entirety.

BACKGROUND

1. Field

Embodiments of the present invention relates to a lithographic apparatus and a method for manufacturing a device.

2. Background

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

Overlay performance, i.e., the accuracy of positioning one layer of the IC over another layer of the IC, is known to be affected by exposure light induced reticle heating. The absorbed energy from the radiation beam during exposure heats up the reticle, causing the reticle to expand. This expansion leads to a time and position dependent pattern displacement on the wafer. The size of the effect is influenced by the used exposure energy, reticle transmission, exposure field size, and expose time.

In some lithography apparatus, a sensor is used to measure the actual reticle expansion over time. The measurement results are used for correction purposes by control software during wafer exposures.

The lithographic apparatus and known methods can cope with a uniform heated reticle, referring to the situation wherein reticle marks are close to the exposed reticle area, the reticle marks being used for reticle alignment relative to the pattern already created on the substrate. In case of uniform reticle heating, the arrangement of the reticle marks close to the exposed reticle area allows sufficient correction. However, it is observed that if only a part of the reticle is exposed, the reticle may expand in a non-uniform way which results in local (thermal) deformation of the reticle pattern, in contrast to the case of uniform heating which results basically in an overall thermal expansion. Due to the non-uniform expansion, the known methods do not provide a sufficient correction.

SUMMARY

It is desirable to have a method for correction of non-uniform reticle heating.

According to an embodiment of the invention, there is provided a device manufacturing method that includes conditioning a radiation beam by an illumination system, imparting the radiation beam with a pattern in its cross-section to form a patterned radiation beam by a reticle including a pattern image area and at least one reticle mark adjacent to the pattern image area. An image of the patterned radiation beam is then projected onto the target portion of a substrate by a projection system, the substrate being held on a substrate table, and the method further includes illuminating the at least one reticle mark by the radiation beam for generating an aerial image of the at least one reticle mark, and projecting the aerial image on an image sensor, the image sensor being arranged on the substrate table. The method further includes collecting image data of the projected aerial image from the image sensor, obtaining from the image data positional parameters of the projected aerial image, and correcting any deviation of the positional parameters from a required position of the aerial image including compensating an illumination beam induced thermal expansion of the reticle by an estimated magnification correction of magnification settings of the projection system, the estimated magnification correction being calculated from a prediction of the temporal thermal expansion of the reticle.

In a further embodiment of the invention, there is provided a lithographic apparatus including an illumination system configured to condition a radiation beam, a support structure constructed to support a reticle, the reticle including a pattern image area and at least one reticle mark adjacent to the pattern image area, the reticle being capable of imparting the radiation beam with a pattern in its cross-section to form a patterned radiation beam. The lithographic apparatus also includes a substrate table constructed to hold a substrate, an image sensor being arranged on the substrate table, a projection system configured to project an image of the patterned radiation beam as a pattern image onto a target portion of the substrate and to project an aerial image of the at least one reticle mark on the image sensor. The apparatus further includes a control system coupled to the support structure, the substrate table and the projection system for controlling an action of the support structure, the substrate table and the projection system, respectively, the control system being configured to collect image data of the projected aerial image from the image sensor, to obtain from the image data positional parameters of the projected aerial image and to correct any deviation of the positional parameters from a required position of the aerial image including a compensation of an illumination beam induced thermal expansion of the reticle by an estimated magnification correction of magnification settings of the projection system, the estimated magnification correction being calculated from a prediction of the temporal thermal expansion of the reticle.

In still another embodiment of the invention, there is provided a computer program on a tangible computer readable storage medium.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Figure 1:
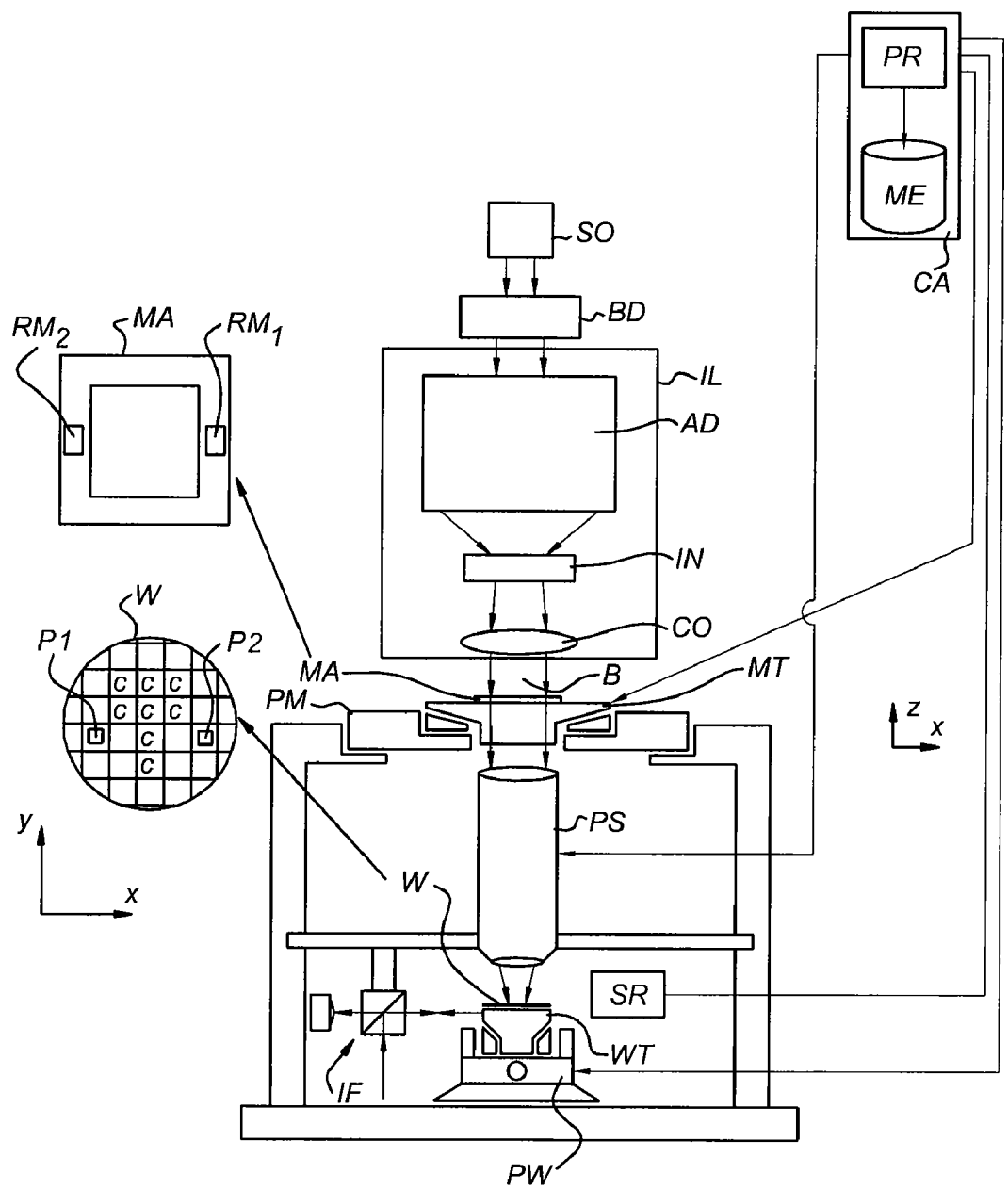
FIG. 1 depicts a lithographic apparatus according to an embodiment of the invention.

FIG. 1 depicts a lithographic apparatus according to one embodiment of the invention. The apparatus includes an illumination system (illuminator) IL configured to condition a radiation beam B (e.g. UV radiation or EUV radiation), a support structure (e.g. a mask table) MT constructed to support a patterning device (e.g. a mask) MA and connected to a first positioner PM configured to accurately position the patterning device in accordance with certain parameters, a substrate table (e.g. a wafer table) WT constructed to hold a substrate (e.g. a resist coated wafer) W and connected to a second positioner PW configured to accurately position the substrate in accordance with certain parameters, and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic, or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic, or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic, and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder, or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks RM1 and RM2 and substrate alignment marks P1 and P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

To control reticle alignment, the lithographic apparatus according to an embodiment of the invention includes a control system that is capable of controlling adjustments for each reticle alignment process. Further, the lithographic apparatus includes an alignment sensor system which is arranged to measure information on the alignment of the reticle(s) as will be explained in more detail below.

Typically, the control system relates to a computer system CA including a processor PR for performing arithmetical operations, and a memory ME. The processor PR is arranged to communicate with memory ME. Memory ME may be any type of memory arranged to store instructions and data, such as a tape unit, a hard disk, Read Only Memory (ROM), Non Volatile Random Access Memory (NVRAM), and Random Access Memory (RAM).

The processor PR may be arranged to read and execute programming lines stored in memory ME providing the processor PR with the functionality to perform reticle alignment and reticle alignment adjustments as will be described in more detail below.

The processor PR may be specially provided to perform the described embodiment of the method, but may also be a central processor arranged to control the lithographic apparatus as a whole and now is provided with additional functionality to perform the described embodiment of the method.

It should be understood that there may be provided additional computer system units, such as memory units, input devices, and read devices known to persons skilled in the art. Moreover, one or more of them may be physically located remote from the processor PR, if required. The processor PR is shown as one box, however, it may include several processing units functioning in parallel or controlled by one main processor PR that may be located remote from one another, as is known to persons skilled in the art.

Although all connections in FIG. 1 are shown as physical connections, one or more of these connections can be wireless. They are only intended to show that "connected" units are arranged to communicate with one another in some way. The computer system can be any signal processing system with any combination of analog, digital, or software technology arranged to perform the functions discussed here.

Before an exposure is done by the lithographic apparatus, several alignment procedures must be carried out, including a reticle alignment which has the purpose of aligning the reticle MA with the wafer stage WT. The basic reticle alignment procedure is described below.

Figure 2:
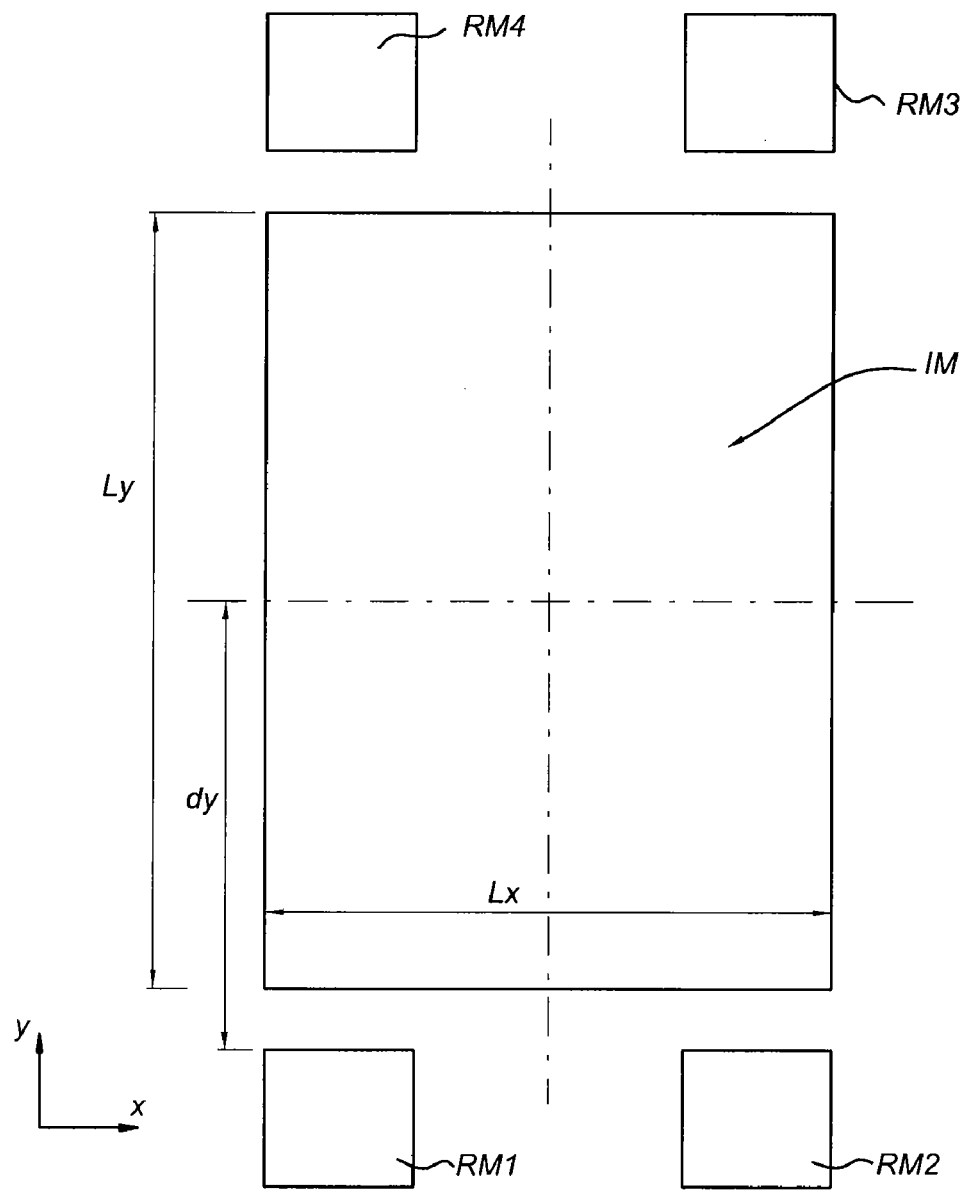
FIG. 2 depicts a layout of a reticle.

FIG. 2 depicts a layout of a reticle.

The reticle includes an image area IM wherein the pattern that is to be transferred to the photoresist layer on the substrate would be projected. Next to this image area, reticle marks (or mask alignment marks) RM1, RM2, RM3, and RM4 are located. In this exemplary reticle layout the reticle marks are located adjacent to the corner regions of the image area, at a projected distance dY along the direction Y from the center of the image area IM. The image area IM has a size LY along the direction Y and a second size LX along the direction X.

By means of an illumination beam, an aerial image of one or more of the reticle marks RM1, RM2, RM3, and RM4 is projected on a respective image sensor arranged on the wafer stage WT as an alignment sensor. Based on the image data collected from the one or more aerial images by the image sensor(s), positional parameters, i.e., information on at least one of the position, rotation, and magnification of the reticle, are obtained. Next, the information on magnification is used to adjust the projection system PS and the distance between the mask table MT that holds the reticle and the wafer stage WT to correct any deviation from the required position of the aerial image. It will be appreciated that the reticle alignment procedure may include more complex scenarios, but a detailed discussion of these scenarios is not relevant in view of the invention and is therefore omitted here.

FIGS. 3a-3e illustrate the effect of non-uniform reticle heating on overlay performance.

Figure 3A:
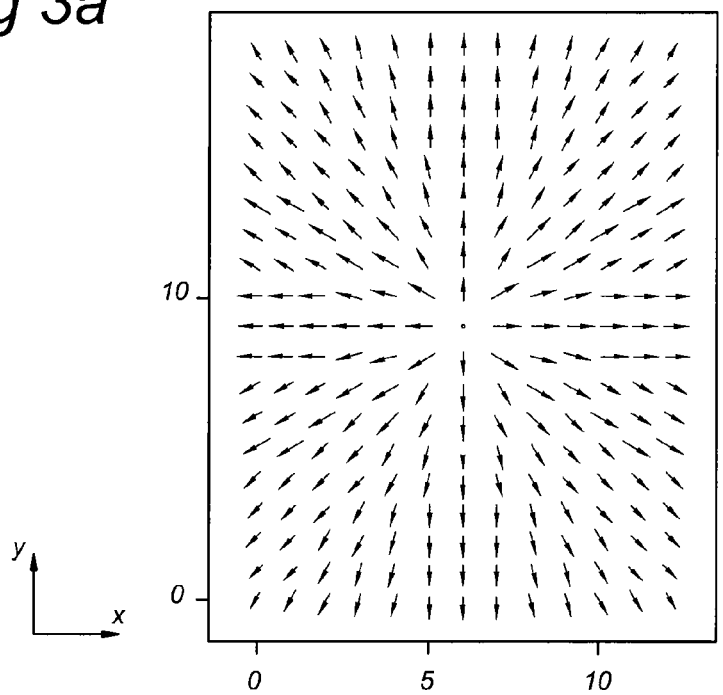
FIGS. 3a-3e illustrate the effect of non-uniform reticle heating on overlay performance.

FIG. 3a depicts an example of a measured field fingerprint at wafer level. The overlay accuracy is depicted by a grid of measurement points. An overlay error in each measurement point is indicated by an arrow. The size and direction of each arrow is a guide of the size and direction of the overlay error at the corresponding measurement point.

FIGS. 3b-3e depict examples of the overlay error distribution for various image size fields. For each image field the overlay error distribution OE is determined by plotting for each measurement point the overlay error as function of the radial distance. The radial distance is determined in relation to a center position of the respective image field.

Figure 3B:
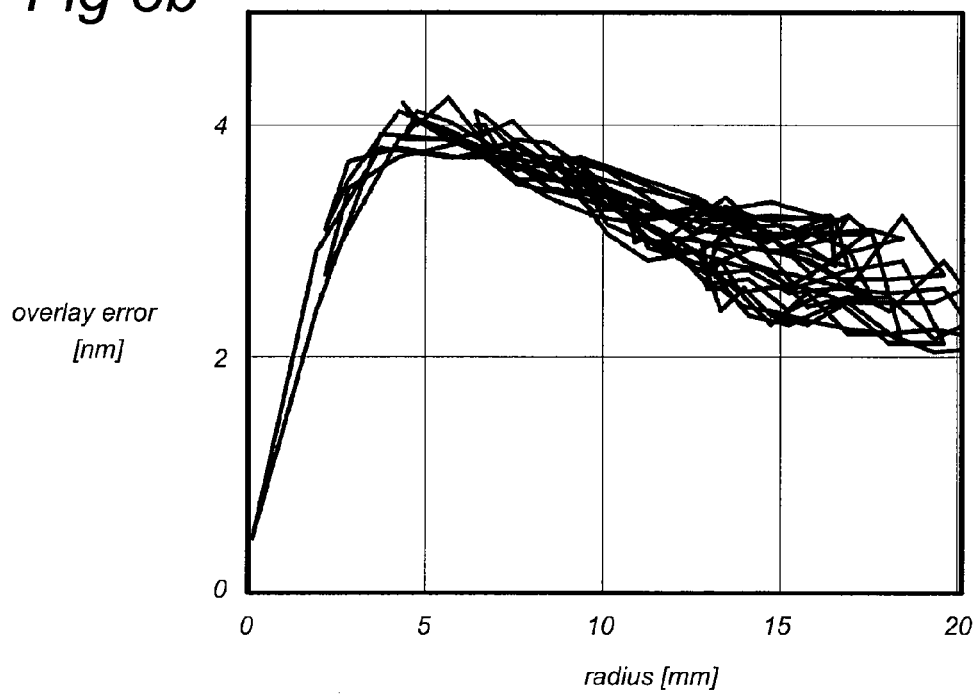

FIG. 3b depicts the overlay error distribution for an image field of 3×3 mm$^2$ for an exposure with dose of 204 mW/cm$^2$ and an exposure time of 313 s.

Figure 3C:
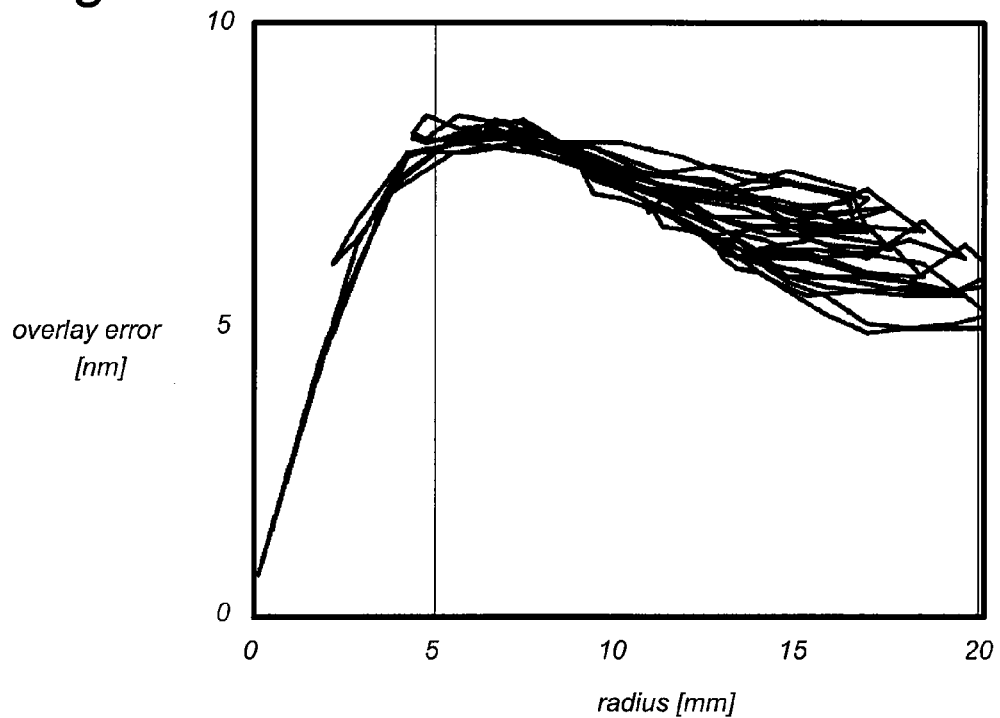

FIG. 3c depicts the overlay error distribution for an image field of 5×5 mm$^2$ for an exposure with dose of 174 mW/cm$^2$ and an exposure time of 368 s.

Figure 3D:
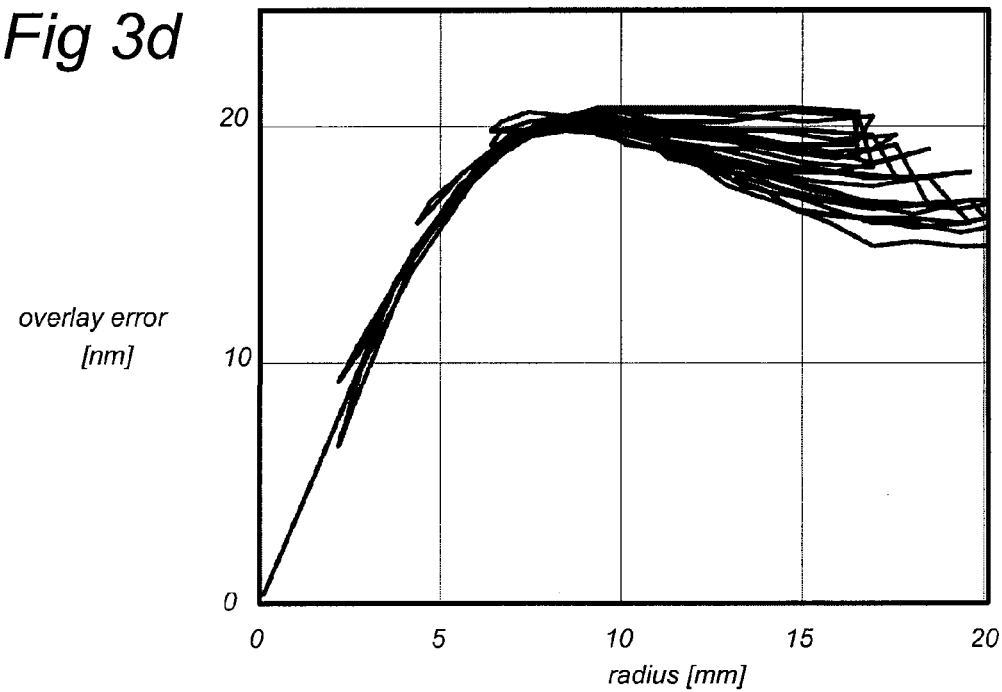

FIG. 3d depicts the overlay error distribution for an image field of 10×10 mm$^2$ for an exposure with dose of 126 mW/cm$^2$ and an exposure time of 506 s.

Figure 3E:
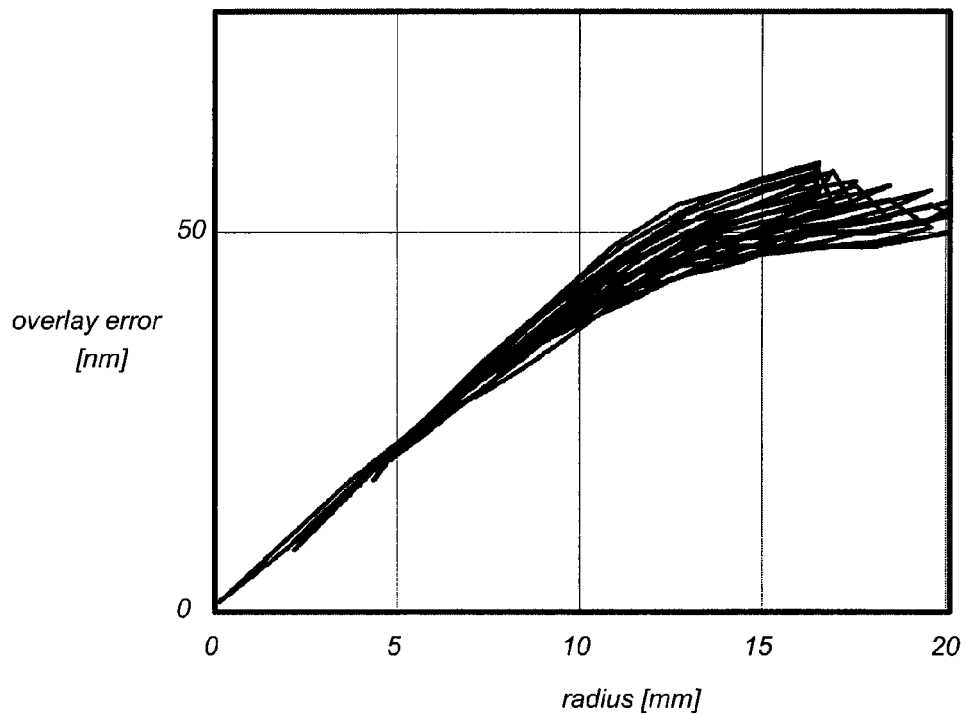

FIG. 3e depicts the overlay error distribution for an image field of 20×20 mm$^2$ for an exposure with dose of 77 mW/cm$^2$ and an exposure time of 836 s.

The dose of exposure as described here relates to a time averaged intensity at the reticle level. The exposure time as described here relates to the total time required for completion of the exposure of the image field.

It is noted that in the above measurements the exposure time was taken longer than a heating time constant of the reticle to avoid non-saturation effects in the temperature distribution of the reticle.

From FIGS. 3b-3e, under the circumstances as given above, a non-linear relation between overlay error and radial distance exists indicative of a non-uniform heating of the reticle during exposure.

The overlay error due to non-uniform heating of the reticle can be reduced by a correction method during reticle alignment which is explained here in more detail.

First, in case of uniform reticle heating, the reticle has expanded in a substantially uniform manner. The expansion is, to a large extent, proportional to the temperature of the reticle. As a result, for a uniform expansion of the reticle, the correction method compensates the expansion by a change of the magnification settings of the projection system PS. Since the expansion is uniform, the relative increase in the distance between the reticle marks RM1, RM2, RM3, and RM4 (say, XR) will be proportional to the expansion of the image area of the reticle.

A correction of the magnification CM, at a given time t, will thus be proportional to a measured expansion in XR. The expansion of the reticle can be derived from the reticle mark aerial image positions as measured by the image sensor(s) of the wafer stage WT.

$$CM(t)=XR(t) \quad [\text{Eq. 1}]$$

In case of non-uniform heating, the above mentioned correction by means of the measured expansion of the reticle mark(s) according to Equation 1, will typically underestimate the actual expansion of the reticle, since the region of the reticle where the reticle marks are located may have a lower temperature than the region of the image area, which is heated by the illumination beam during exposure. Also, non-uniform heating is a dynamic effect, due to the fact that a stationary state (or a saturation) of the temperature distribution will be reached only after a finite time.

In the correction method, the measured reticle expansion XR will be compensated for the predicted effect of heating induced expansion ET(t) of the reticle as a function of time t, and applying the result as an estimated magnification correction CM' as a function of time t, i.e. as a function of exposure time t. This method is illustrated by Equation 2. The value of the weighting factor k may depend on the position of the reticle marks and the size of the illuminated image area (which will be explained in more detail with reference to Equation 6).

$$CM'(t)=k \cdot XR(t)+(1-k) \cdot ET(t) \quad [\text{Eq. 2}]$$

Elaborating the above, the model predicted expansion in saturation of illuminated reticle regions ES is directly related to the time averaged intensity at reticle level IR by a fixed proportionality constant C:

$$ES=C \cdot IR \quad [\text{Eq. 3}],$$

where the time averaged intensity at reticle level IR, is given by:

$$IR=(N \cdot D)/(M^2 \cdot Lt \cdot te) \quad [\text{Eq. 4}],$$

where N is a number of exposed fields per wafer, D is an exposure dose, M is a demagnification factor of the projection system, Lt is a transmission of the projection system for the illumination beam, and te is the total time used to expose N fields.

Now, the predicted reticle expansion ET of the illuminated reticle regions, at any given time t, can be calculated from Equation 3, by including the temporal effect of saturation by a time correction factor:

$$ET(t)=ES \cdot (1-\exp(-t/\tau)) \quad [\text{Eq. 5}],$$

where $\tau$ is the reticle's thermal time constant.

Finally, the estimated magnification correction CM'(t) follows from an optimal combination of the measured reticle expansion XR(t) and the model predicted value ET(t), as illustrated by Equation 2.

A suitable choice for the value of the weighting factor k therein, is affected by the position of the reticle marks and the size of the illuminated image area (with reference to FIG. 2):

$$k=(Ly/2)/dY \quad [\text{Eq. 6}],$$

where Ly is the length of the reticle in direction Y and dY is the projected distance in direction Y between the center of the reticle and the position of each respective reticle mark RM1, RM2, RM3, and RM4. Thus, the weighting factor k is a factor determined by the layout of the reticle, i.e., the size of the reticle and the location of the reticle mark with respect to the location of illuminated image area.

Based on Equation 5, an estimate for the reticle expansion E(t) at a given time t during exposure can be calculated for each of the measurements as shown in FIGS. 3b-3e. The results are shown in Table 1. Also, in Table 1, the results of the reticle expansion E0 as measured substantially at the center of the image area and the expansion XR of the reticle mark are included.

TABLE 1

Calculated estimate for reticle expansion E(t) according to Equation 5, measured expansion E0 at center of the image area of the reticle and measured expansion XR of the reticle mark for exposures under the conditions of FIGS. 3b-3e.

| Image field (mm$^2$) | Exposure time (s) | Intensity at reticle IR (mW/cm$^2$) | E(t) (ppm) | E0 (ppm) | XR (ppm) | Corrected reticle expansion CM' (ppm) |
|---|---|---|---|---|---|---|
| 3 × 3 | 313 | 204 | 9.7 | 1.47 | 0.3 | 2.1 |
| 5 × 5 | 368 | 174 | 9.0 | 2.79 | 0.66 | 2.8 |
| 10 × 10 | 506 | 126 | 7.6 | 4.39 | 1.86 | 3.9 |
| 20 × 20 | 836 | 77 | 5.3 | 4.2 | 4.18 | 4.0 |

The reticle's thermal time constant for heating $\tau$ = 300 s.

The expansion XR measured at the reticle mark is smaller than the measured expansion E0 at the center of the reticle. At the same time, the calculated estimate E(t) for uniform heating is clearly much larger than the measured expansion E0 at the center of the reticle. Both observations indicate that the expansion of the reticle is non-uniform and localized substantially in the (exposed) image area of the reticle.

It is recognized that the measured expansion E0 at the center of the reticle can be estimated by the estimated magnification correction CM' as defined by Equation 2. From Table 1, it can be observed that CM' provides a better approximation (with relatively smaller error) than either XR or E(t). Thus, during a sequence of exposures, an estimate for the actual expansion of the image area of the reticle can be obtained by measuring the expansion of the reticle mark in between exposures using the relation between CM' and XR according to Equation 2.

It is noted that correction of the reticle expansion by a correction estimate CM' is not limited to a linear relation between expansion XR measured at the reticle mark and predicted reticle expansion ET as defined by Equation 2. It will be appreciated that alternatively CM' may be determined from either a weighted non-linear relation or a weighted polynomial relation with XR and ET.

Figure 4:
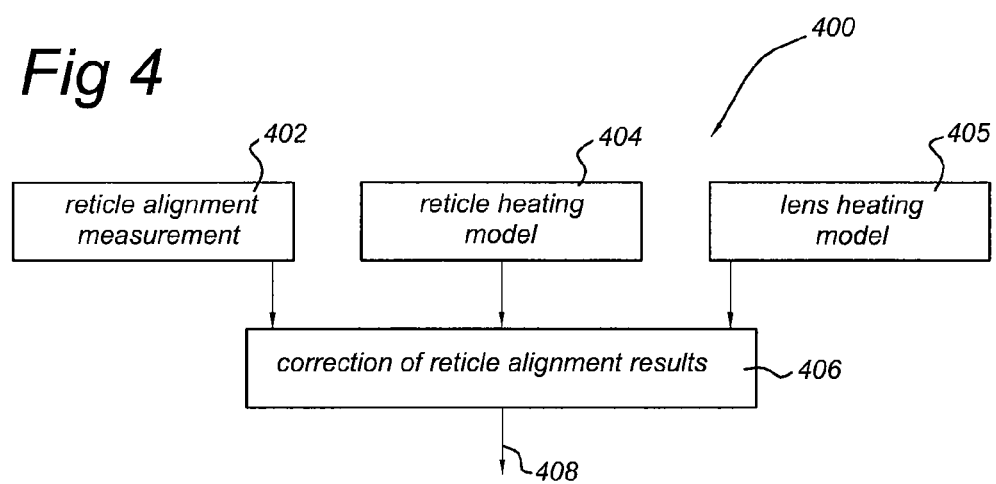
FIG. 4 depicts a correction method in accordance with an embodiment of the present invention.

FIG. 4 depicts a correction method 400 in accordance with an embodiment of the present invention.

The correction method 400 seeks to compensate the effect of non-uniform reticle heating by means of a software feed-forward model. The model output is the temporal and spatial displacement of the reticle marks, which are computed using a temporal and spatial correction by a weighted average of the expansion XR measured at the reticle mark and a predicted temporal reticle expansion ET. The input parameters which may be readily available from the control software of the lithographic apparatus, are the exposure energy IR, reticle transmission LT, exposure field size LX in direction X and LY in direction Y, and the time constant for heating $\tau$. Further input to the model is the actual time that exposure is taking place.

The interaction of the model output of the temporal and spatial displacement of the reticle marks with the reticle alignment measurement is illustrated in FIG. 4.

In block 402, the reticle alignment is measured in a manner known in the art. The processor PR determines information on positional parameters of one or more of the alignment marks RM1, RM2, RM3, and RM4 by means of the image sensor as illustrated in FIG. 2. The positional parameters relate to at least one of position, orientation, and magnification of the aerial image of the measured reticle mark. In block 404, the processor PR determines information on temporal and spatial displacement of the reticle marks according to the model described above using input parameters as described above.

Next, in block 406 the processor PR uses the information on temporal and spatial displacement of the reticle marks from block 404, for correcting the measured reticle information from block 402. The corrected reticle information is then used for determining an alignment of the reticle with the substrate table. As an output 408 the processor provides corrected reticle alignment data based on the estimated magnification correction CM' for use in an alignment procedure of the substrate and the reticle. Such alignment procedure is carried out by the processor PR in a manner known in the art by controlling a position of the mask table MT and/or a position of the substrate table WT relative to each other.

It is noted that the correction model 400 may operate in conjunction with a lens (projection system) heating model which provides a correction for a thermally induced lens magnification effect. During exposure the projection system is heated, in which the heating of the lens results in a change of the lens magnification (relative to a magnification value at a reference temperature). In case lens heating is corrected, the correction model includes a block 405, in which the processor derives information on the change of magnification due to heating of the lens. The temperature- and/or time-based change of magnification is entered into block 406, in which the processor applies the information on the lens magnification as a further parameter for correcting the obtained information on the positional parameters of the projected aerial image.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure, or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157, or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic, and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below. It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method, comprising:
    conditioning a radiation beam using an illumination system;
    imparting the radiation beam with a pattern in its cross-section to form a patterned radiation beam using a reticle comprising a pattern image area and at least one reticle mark adjacent to the pattern image area;
    projecting an image of the patterned radiation beam onto a target portion of a substrate by a projection system, the substrate being held on a substrate table;
    illuminating the at least one reticle mark by the radiation beam to generate an aerial image of the at least one reticle mark;
    projecting the aerial image on an image sensor, the image sensor being arranged on the substrate table;
    collecting image data of the projected aerial image from the image sensor;
    obtaining, from the image data, positional parameters of the projected aerial image;
    determining an estimated magnification correction of magnification settings of the projection system from a weighted average of a measured temporal thermal expansion and a prediction of a temporal thermal expansion of the reticle; and
    correcting any deviation of the positional parameters from a required position of the aerial image, wherein the correction comprises compensating an illumination beam induced thermal expansion of the reticle by the estimated magnification correction.

2. The method of claim 1, wherein the weighted average of the measured temporal thermal expansion $XR(t)$ and the predicted temporal thermal expansion $ET(t)$ of the reticle, is given by:

$$CM(t)=k \cdot XR(t)+(1-k) \cdot ET(t),$$

wherein k is a weighting factor.

3. The method of claim 2, further comprising determining the weighting factor k from a center position of at least one reticle mark relative to a position of the pattern image area of the reticle.

4. The method of claim 3, wherein the weighting factor k is determined by:

$$k=(Ly/2)/dY,$$

where Ly is the length of the reticle in a first direction and dY is a distance in the first direction between a center of the pattern image area of the reticle and a center position of the at least one reticle mark.

5. The method of claim 1, wherein the weighted average is a non-linear function of the temporal thermal expansion $XR(t)$ and the predicted temporal thermal expansion $ET(t)$ of the reticle.

6. The method of claim 1, further comprising determining the temporal thermal expansion of the reticle from a thermal expansion of the reticle in saturated state.

7. The method of claim 6, wherein the determination of the temporal thermal expansion $ET(t)$ of the reticle from the thermal expansion ES of the reticle in saturated state, is given by:

$$ET(t)=ES \cdot (1-\exp(-t/\tau)),$$

where $\tau$ is a thermal time constant.

8. The method of claim 6, further comprising determining the thermal expansion of the reticle in saturated state from a time averaged intensity at the reticle.

9. The method of claim 8, wherein a determination of the time averaged intensity IR at the reticle is given by:

$$IR=(N \cdot D)/(M^2 \cdot Lt \cdot te),$$

where N is a number of exposed fields per substrate, D is an exposure dose, M is a demagnification factor of the projection system, Lt is a transmission of the projection system for the illumination beam, and to is the total time used to expose N fields.

10. A lithographic apparatus, comprising:
an illumination system configured to condition a radiation beam;
a support device configured to support a reticle, the reticle comprising a pattern image area and at least one reticle mark adjacent to the pattern image area, the reticle being capable of imparting the radiation beam with a pattern to form a patterned radiation beam;
a substrate table configured to hold a substrate;
an image sensor being arranged on the substrate table;
a projection system configured to project an image of the patterned radiation beam as a pattern image onto a target portion of the substrate and to project an aerial image of the at least one reticle mark on the image sensor; and
a control system coupled to the support device, the substrate table, and the projection system, the control system being configured to:
collect image data of the projected aerial image from the image sensor;
obtain from the image data positional parameters of the projected aerial image;
determine an estimated magnification correction of magnification settings of the projection system from a weighted average of a measured temporal thermal expansion and a prediction of a temporal thermal expansion of the reticle; and
correct any deviation of the positional parameters from a required position of the aerial image, wherein the correction comprises a compensation of an illumination beam induced thermal expansion of the reticle by the estimated magnification correction.

11. A non-transient computer readable storage medium having computer program code recorded thereon to be loaded by a computer, the computer comprising a processor and memory, the memory being connected to the processor, the computer being part of a lithographic apparatus, the lithographic apparatus comprising:
an illumination system configured to condition a radiation beam;
a support device configured to support a reticle, the reticle comprising a pattern image area and at least one reticle mark adjacent to the pattern image area, the reticle being capable of imparting the radiation beam with a pattern to form a patterned radiation beam;
a substrate table configured to hold a substrate;
an image sensor being arranged on the substrate table;
a projection system configured to project an image of the patterned radiation beam as a pattern image onto a target portion of the substrate and to project an aerial image of the at least one reticle mark on the image sensor; and
the computer configured as a control system coupled to the support device, the substrate table, and the projection system, wherein the computer program code when executed by a processor produces desired results, comprising:
computer program code that enables the processor to collect image data of the projected aerial image from the image sensor;
computer program code that enables the processor to obtain from the image data positional parameters of the projected aerial image;
computer program code that enables the processor to determine an estimated magnification correction of magnification settings of the projection system from a weighted average of a measured temporal thermal expansion and a prediction of a temporal thermal expansion of the reticle; and
computer program code that enables the processor to correct any deviation of the positional parameters from a required position of the aerial image, wherein the correction comprises a compensation of an illumination beam induced thermal expansion of the reticle by the estimated magnification correction.

12. The non-transient computer readable storage medium of claim 11, further comprising computer program code that enables the processor to determine information on position and orientation of the at least one reticle mark.

13. The non-transient computer readable storage medium of claim 12, further comprising computer program code that enables the processor to determine an alignment of the reticle with the substrate table from the determined information on position and orientation of the at least one reticle mark.

14. The non-transient computer readable storage medium of claim 13, further comprising computer program code that enables the processor to correct reticle alignment results based on the estimated magnification correction for use in an alignment procedure of the substrate and the reticle.

15. The non-transient computer readable storage medium of claim 11, further comprising a correction for a thermally induced lens magnification effect, comprising:
computer program code that enables the processor to derive information on a change of magnification due to heating of the lens, and computer program code that enables the processor to apply the information on the change of magnification as a further parameter for correcting the obtained information on magnification of the projected aerial image.

* * * * *

UNITED STATES PATENT AND TRADEMARK OFFICE
CERTIFICATE OF CORRECTION

| | | |
|---|---|---|
| PATENT NO. | : 8,184,265 B2 | Page 1 of 1 |
| APPLICATION NO. | : 12/492473 | |
| DATED | : May 22, 2012 | |
| INVENTOR(S) | : Peter Hanzen Wardenier | |

It is certified that error appears in the above-identified patent and that said Letters Patent is hereby corrected as shown below:

Col. 13, line 4, claim 9, after "and" delete "to" and insert -- te --.

Signed and Sealed this
Third Day of July, 2012

David J. Kappos
*Director of the United States Patent and Trademark Office*